(12) United States Patent
Hareyama

(10) Patent No.: US 10,580,816 B2
(45) Date of Patent: Mar. 3, 2020

(54) SOLID-STATE IMAGING DEVICE, CAMERA MODULE, AND ELECTRONIC APPARATUS

(71) Applicant: SONY CORPORATION, Tokyo (JP)

(72) Inventor: Kosuke Hareyama, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/522,001

(22) PCT Filed: Oct. 22, 2015

(86) PCT No.: PCT/JP2015/079818
§ 371 (c)(1),
(2) Date: Apr. 26, 2017

(87) PCT Pub. No.: WO2016/072279
PCT Pub. Date: May 12, 2016

(65) Prior Publication Data
US 2017/0317127 A1 Nov. 2, 2017

(30) Foreign Application Priority Data
Nov. 4, 2014 (JP) ................. 2014-223921

(51) Int. Cl.
*H01L 27/146* (2006.01)
*H04N 5/378* (2011.01)

(52) U.S. Cl.
CPC .. *H01L 27/14627* (2013.01); *H01L 27/14607* (2013.01); *H04N 5/378* (2013.01)

(58) Field of Classification Search
CPC ................. H04N 5/378; H01L 27/14627
See application file for complete search history.

(56) References Cited

U.S. PATENT DOCUMENTS 7,009,645 B1  3/2006 Sandini et al.
2006/0215049 A1* 9/2006 Sandini ............... G01J 1/4228
                                                  348/275
(Continued)

FOREIGN PATENT DOCUMENTS

CN  101924115 A  12/2010
CN  103098213 A  5/2013
(Continued)

OTHER PUBLICATIONS

International Search Report and Written Opinion of PCT Application No. PCT/JP2015/079818, dated Jan. 12, 2016, 12 pages of English Translation and 09 pages of ISRWO.
(Continued)

*Primary Examiner* — Nhan T Tran
(74) *Attorney, Agent, or Firm* — Chip Law Group

(57) ABSTRACT

The present technology relates to a solid-state imaging device capable of preventing defects in the appearance thereof, a camera module, and an electronic apparatus. The solid-state imaging device to be provided includes: a semiconductor substrate having pixels formed therein, the pixels each including a photoelectric conversion element; and on-chip lenses formed above the semiconductor substrate, the on-chip lenses corresponding to the pixels. The area in which the on-chip lenses are formed is extended to a peripheral area outside an imaging area formed with the pixels. The present technology can be applied to solid-state imaging devices, such as CMOS image sensors.

14 Claims, 18 Drawing Sheets

(56) References Cited

U.S. PATENT DOCUMENTS

| | | | |
|---|---|---|---|
| 2009/0302406 A1* | 12/2009 | Gambino | H01L 27/14627 257/432 |
| 2010/0155869 A1* | 6/2010 | Komori | H01L 27/14618 257/432 |
| 2010/0309354 A1* | 12/2010 | Tsuduki | H01L 27/14618 348/294 |
| 2011/0129955 A1 | 6/2011 | Gambino et al. | |
| 2013/0134540 A1 | 5/2013 | Maeda et al. | |
| 2013/0335590 A1* | 12/2013 | Kurihara | H01L 31/02325 348/222.1 |
| 2014/0210032 A1 | 7/2014 | Maeda et al. | |

FOREIGN PATENT DOCUMENTS

| | | | |
|---|---|---|---|
| CN | 105074926 A | 11/2015 | |
| EP | 1089342 A1 | 4/2001 | |
| EP | 2595189 A1 | 5/2013 | |
| JP | 9-232551 A | 9/1997 | |
| JP | 2001-160926 A | 6/2001 | |
| JP | 2009-130215 A | 6/2009 | |
| JP | 2010-147327 A | 7/2010 | |
| JP | 2010-287619 A | 12/2010 | |
| JP | 2011-146481 A | 7/2011 | |
| JP | 2012-23251 A | 2/2012 | |
| JP | 2012-174853 A | 9/2012 | |
| JP | 2012174853 A * | 9/2012 | H04N 5/335 |
| KR | 10-2011-0022573 A | 3/2011 | |
| KR | 10-2013-0090396 A | 8/2013 | |
| TW | 201010066 A | 3/2010 | |
| TW | 201214687 A | 4/2012 | |
| TW | 201438214 A | 10/2014 | |
| WO | 2009/149222 A1 | 12/2009 | |
| WO | 2012/008387 A1 | 1/2012 | |
| WO | 2014/148276 A1 | 9/2014 | |

OTHER PUBLICATIONS

International Preliminary Report on Patentability of PCT Application No. PCT/JP2015/079818, dated May 17, 18, 2017, 13 pages of English Translation and 06 pages of IPRP.

* cited by examiner

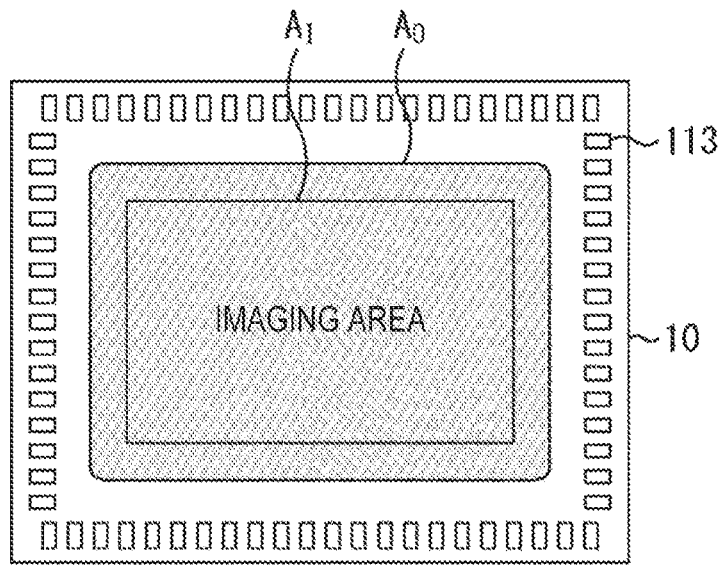
FIG. 14A
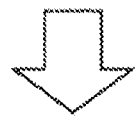
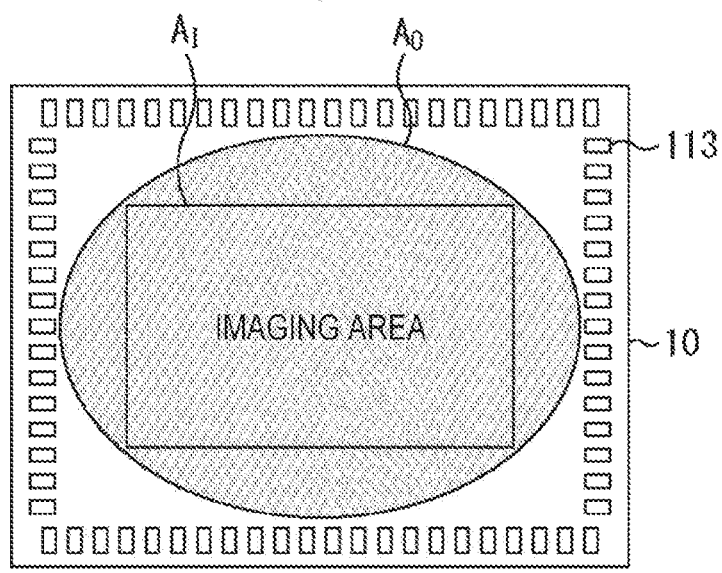
FIG. 14B

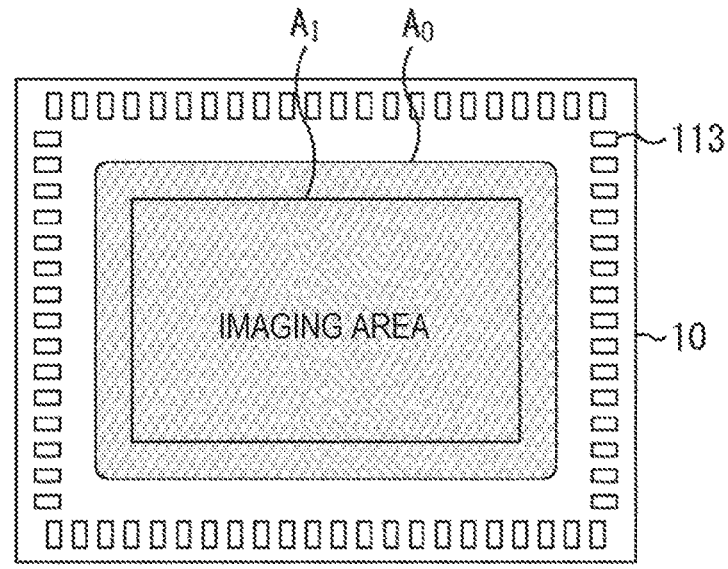
FIG. 15A
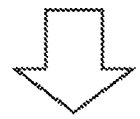
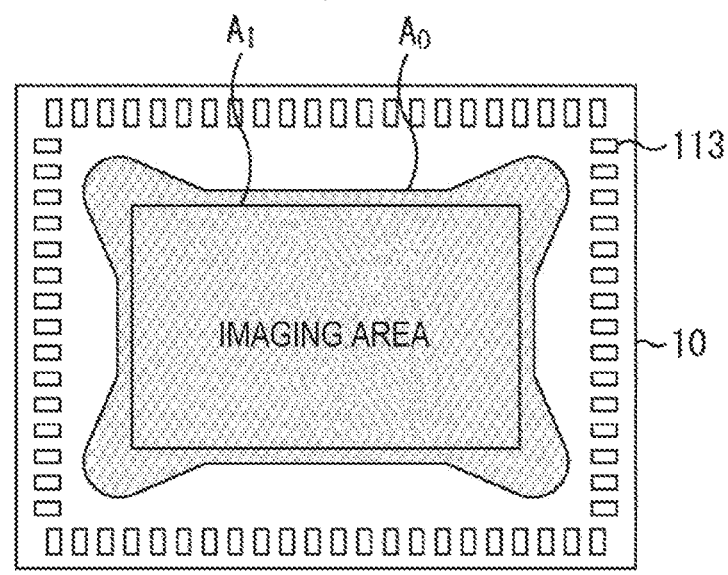
FIG. 15B

SOLID-STATE IMAGING DEVICE, CAMERA MODULE, AND ELECTRONIC APPARATUS

CROSS-REFERENCE TO RELATED APPLICATIONS

This application is a U.S. National Phase of International Patent Application No. PCT/JP2015/079818 filed on Oct. 22, 2015, which claims priority benefit of Japanese Patent Application No. JP 2014-223921 filed in the Japan Patent Office on Nov. 4, 2014. Each of the above-referenced applications is hereby incorporated herein by reference in its entirety.

TECHNICAL FIELD

The present technology relates to solid-state imaging devices, camera modules, and electronic apparatuses, and more particularly, to a solid-state imaging device capable of preventing defects in appearance, a camera module, and an electronic apparatus.

BACKGROUND ART

In a solid-state imaging device such as a complementary metal oxide semiconductor (CMOS) image sensor, light is collected by on-chip lenses (OCLs) formed above the light incidence plane (see Patent Document 1, for example).

CITATION LIST

Patent Document

Patent Document 1: Japanese Patent Application Laid-Open No. 2014-72471

SUMMARY OF THE INVENTION

Problems to be Solved by the Invention

In a solid-state imaging device, however, a defect in appearance, such as resin corrugation, might occur due to resin expansion caused by heat, moisture absorption, or the like in a flat area outside the area in which the on-chip lenses are formed. Therefore, there is a demand for prevention of such defects in appearance.

The present technology has been developed in view of those circumstances, and an object thereof is to prevent defects in appearance, such as resin corrugation, in a solid-state imaging device.

Solutions to Problems

A solid-state imaging device of a first aspect of the present technology includes: a semiconductor substrate having a plurality of pixels formed therein, the pixels each including a photoelectric conversion element; and on-chip lenses formed above the semiconductor substrate, the on-chip lenses corresponding to the pixels, wherein the area in which the on-chip lenses are formed is extended to a peripheral area outside an imaging area formed with the pixels.

The solid-state imaging device of the first aspect of the present technology includes: a semiconductor substrate that has a plurality of pixels each including a photoelectric conversion element formed therein, and on-chip lenses that are formed above the semiconductor substrate and correspond to the pixels. Also, the area in which the on-chip lenses are formed is extended to a peripheral area outside the imaging area formed with the pixels.

A camera module of a second aspect of the present technology includes: a solid-state imaging device; an optical lens system; and a signal processing device. The solid-state imaging device includes: a semiconductor substrate having a plurality of pixels formed therein, the pixels each including a photoelectric conversion element; and on-chip lenses formed above the semiconductor substrate, the on-chip lenses corresponding to the pixels, wherein the area in which the on-chip lenses are formed is extended to a peripheral area outside an imaging area formed with the pixels.

The camera module of the second aspect of the present technology includes a solid-state imaging device, an optical lens system, and a signal processing device. Also, the solid-state imaging device includes: a semiconductor substrate that has a plurality of pixels each including a photoelectric conversion element formed therein; and on-chip lenses that are formed above the semiconductor substrate and correspond to the pixels. The area in which the on-chip lenses are formed is extended to a peripheral area outside an imaging area formed with the pixels.

An electronic apparatus of a third aspect of the present technology includes a solid-state imaging device that includes: a semiconductor substrate having a plurality of pixels formed therein, the pixels each including a photoelectric conversion element; and on-chip lenses formed above the semiconductor substrate, the on-chip lenses corresponding to the pixels, wherein the area in which the on-chip lenses are formed is extended to a peripheral area outside an imaging area formed with the pixels.

The electronic apparatus of the third aspect of the present technology includes a solid-state imaging device that includes: a semiconductor substrate that has a plurality of pixels each including a photoelectric conversion element formed therein; and on-chip lenses that are formed above the semiconductor substrate and correspond to the pixels. The area in which the on-chip lenses are formed is extended to a peripheral area outside an imaging area formed with the pixels.

Effects of the Invention

According to the first through third aspects of the present technology, it is possible to prevent defects in appearance, such as resin corrugation, in a solid-state imaging device.

It should be noted that effects of the present technology are not limited to the effects described herein, and may include any of the effects described in the present disclosure.

BRIEF DESCRIPTION OF DRAWINGS

FIGS. 14A and 14B are enlarged top view of an on-chip lens formation area having an elliptical shape.

FIGS. 15A and 15B are enlarged top view of an on-chip lens formation area having a shape with a predetermined curvature.

MODES FOR CARRYING OUT THE INVENTION

The following is a description of an embodiment of the present technology, with reference to the drawings. It should be noted that explanation will be made in the following order.

1. Configuration of a solid-state imaging device
2. Configurations of camera modules
3. Configuration of an electronic apparatus
4. Examples of use of a solid-state imaging device <1. Configuration of a Solid-State Imaging Device>
(Configuration of a Solid-State Imaging Device)

Figure 1:
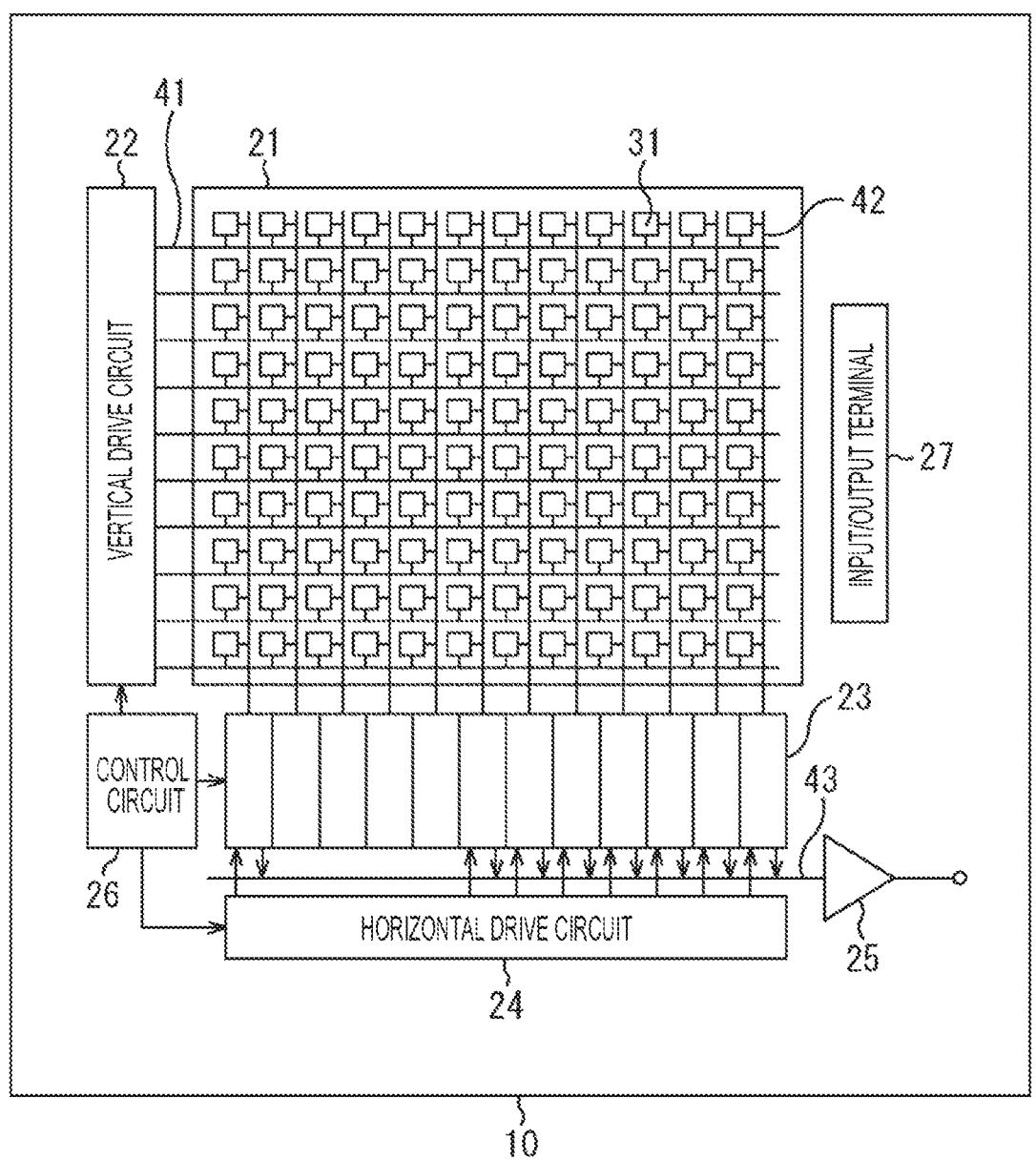
FIG. 1 is a diagram showing an example configuration of a solid-state imaging device.

FIG. 1 is a diagram showing an example configuration of a solid-state imaging device.

The solid-state imaging device 10 shown in FIG. 1 is an image sensor, such as a complementary metal oxide semiconductor (CMOS) image sensor. The solid-state imaging device 10 captures incident light (image light) from the object via an optical lens system (not shown), converts the amount of the incident light gathered on the imaging surface into an electrical signal for each pixel, and outputs the electrical signal as a pixel signal.

In FIG. 1, the solid-state imaging device 10 includes a pixel array unit 21, a vertical drive circuit 22, column signal processing circuits 23, a horizontal drive circuit 24, an output circuit 25, a control circuit 26, and an input/output terminal 27.

In the pixel array unit 21, unit pixels 31 are arranged in a two-dimensional array. A unit pixel 31 includes a photodiode as a photoelectric conversion element, and pixel transistors.

The vertical drive circuit 22 is formed with a shift register, for example, selects a predetermined pixel drive line 41, supplies a pulse for driving the unit pixels 31 to the selected pixel drive line 41, and drives the unit pixels 31 on a row-by-row basis. That is, the vertical drive circuit 22 sequentially selects and scans the respective unit pixels 31 of the pixel array unit 21 on a row-by-row basis in the vertical direction, and supplies pixel signals in accordance with the signal charges generated in accordance with the amounts of light received at the photodiodes of the respective unit pixels 31, to the column signal processing circuits 23 through vertical signal lines 42.

The column signal processing circuits 23 are provided for the respective columns of the unit pixels 31, and perform signal processing such as denoising, on a column-by-column basis, on signals that are output from the unit pixels 31 of one row. For example, the column signal processing circuits 23 perform signal processing, such as correlated double sampling (CDS) for removing fixed pattern noise inherent to the pixels, and analog/digital (A/D) conversion.

The horizontal drive circuit 24 is formed with a shift register, for example. The horizontal drive circuit 24 sequentially selects the respective column signal processing circuits 23 by sequentially outputting horizontal scan pulses, and causes the respective column signal processing circuits 23 to output pixel signals to a horizontal signal line 43.

The output circuit 25 performs signal processing on signals sequentially supplied from the respective column signal processing circuits 23 through the horizontal signal line 43, and outputs the processed signals. The output circuit 25 might perform only buffering, or might perform black level control, column variation correction, and various kinds of digital signal processing, for example.

The control circuit 26 receives an input clock signal and data giving a command of an operation mode or the like, and outputs data of internal information and the like about the solid-state imaging device 10. That is, in accordance with a vertical synchronization signal, a horizontal synchronization signal, and a master clock signal, the control circuit 26 generates a clock signal and a control signal that serve as the references for operations of the vertical drive circuit 22, the column signal processing circuits 23, the horizontal drive circuit 24, and the like. The control circuit 26 outputs the generated clock signal and control signal to the vertical drive circuit 22, the column signal processing circuits 23, the horizontal drive circuit 24, and the like.

The input/output terminal 27 exchanges signals with the outside.

The solid-state imaging device 10 of FIG. 1 having the above configuration is a so-called column-A/D CMOS image sensor in which the column signal processing circuits 23 that perform a CDS process and an A/D conversion process are provided for the respective pixel columns.

(Detailed Structure of the Solid-State Imaging Device)

Figure 2:
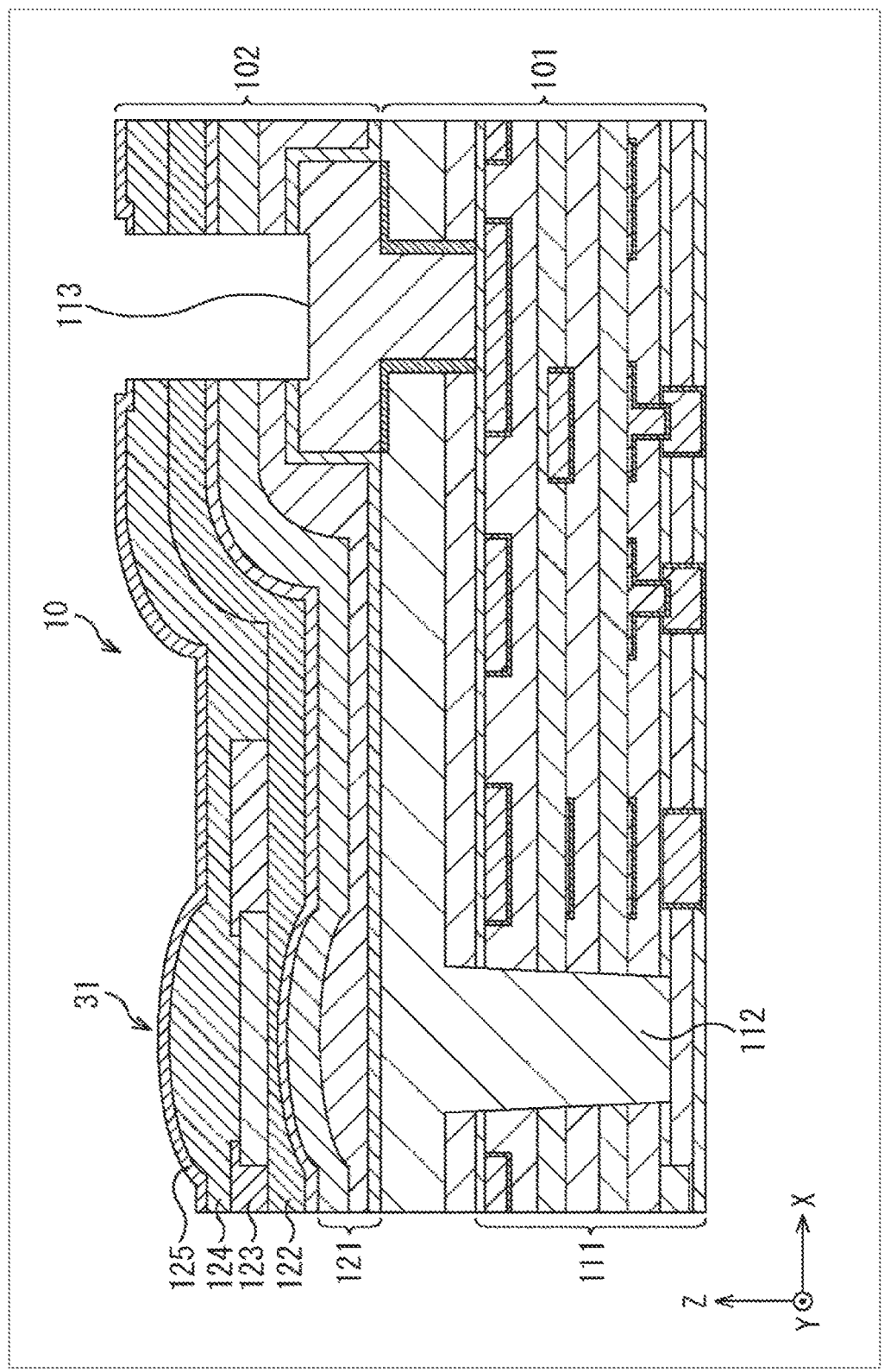
FIG. 2 is an enlarged cross-sectional view of part of the solid-state imaging device.

Next, a detailed structure of the solid-state imaging device 10 shown in FIG. 1 is described. FIG. 2 is an enlarged cross-sectional view of part of the solid-state imaging device 10.

In FIG. 2, the solid-state imaging device 10 is formed with a semiconductor substrate 101 and a light collecting layer 102 formed above the semiconductor substrate 101. In the semiconductor substrate 101, photodiodes 112 formed with PN junctions are formed in a silicon substrate 111 for the respective unit pixels 31.

Although not shown in the drawing, pixel transistors such as transfer transistors, a memory unit, and the like are also formed in the silicon substrate 111. Further, pad electrodes 113 are formed in openings formed in the light collecting layer 102, and are connected to external electrodes via wires.

Also, color filters 123 and an antireflection film 125 are formed as the light collecting layer 102 above (the upper surface of) the semiconductor substrate 101 via an inorganic film 121 formed with a silicon oxynitride (SiON) film or the like and a flattening film 122 for the inorganic film 121. It should be noted that a lens resin film 124 is formed between the color filters 123 and the antireflection film 125. In this manner, on-chip lenses corresponding to the unit pixels 31 are formed with the lens resin film 124, the antireflection film 125, and the like, which are stacked on the color filters 123.

(Cause of a Corrugation Phenomenon and a Method of Avoiding a Corrugation Phenomenon)

As described earlier, in a solid-state imaging device, a resin corrugation phenomenon (hereinafter referred to as a "corrugation phenomenon") may occur due to the influence of resin expansion caused by heat, moisture absorption, or the like in a flat area (hereinafter referred to as the "flat area $A_F$") outside the area in which on-chip lenses are formed (this area will be hereinafter referred to as the "on-chip lens formation area $A_O$"). When this kind of corrugation phenomenon occurs, the resin is corrugated, and the solid-state imaging device has a defect in appearance.

Figure 3:
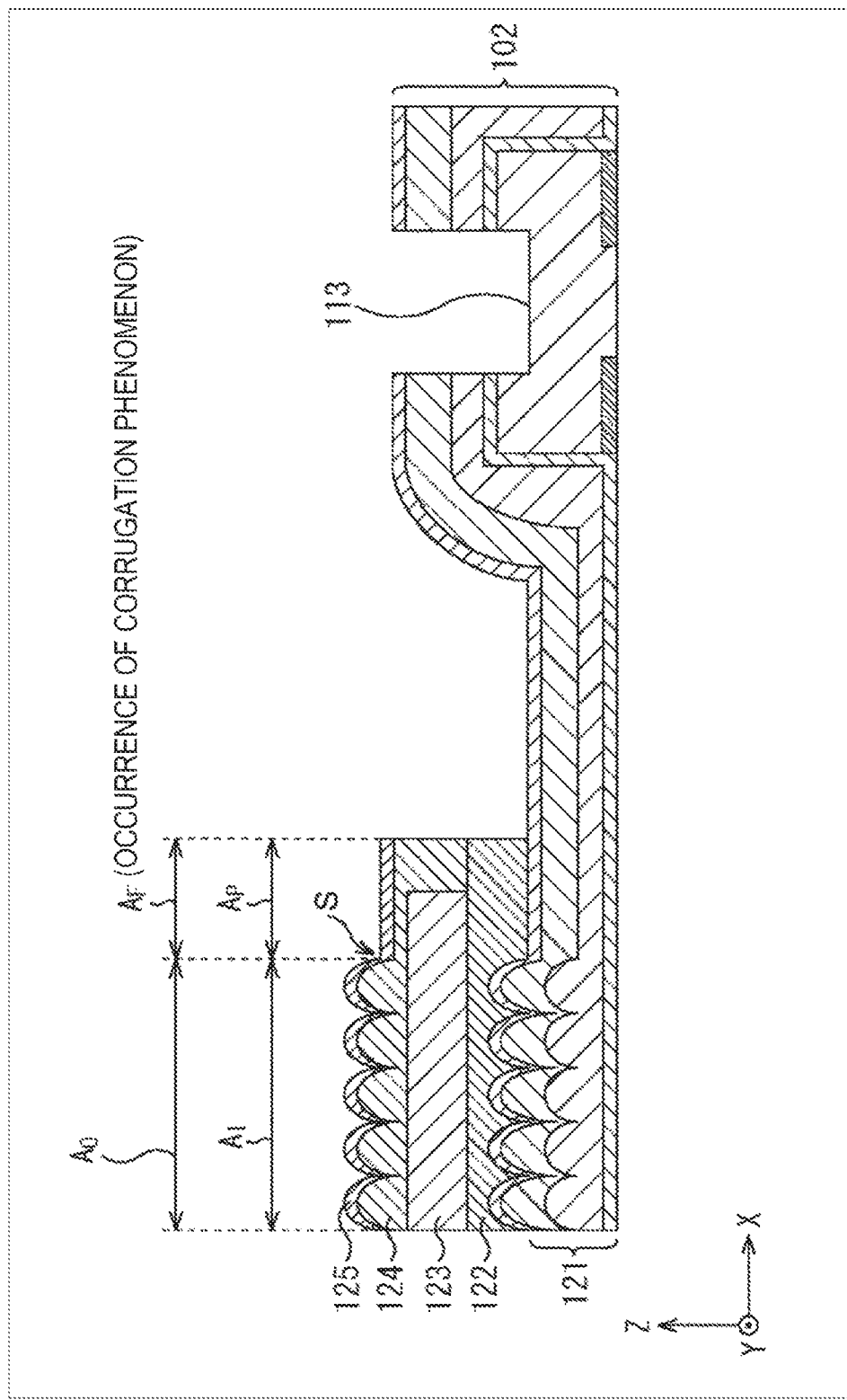
FIG. 3 is a cross-sectional diagram for explaining a corrugation phenomenon that occurs at the boundary between an on-chip lens formation area and a flat area.

FIG. 3 is a cross-sectional view of the boundary between the on-chip lens formation area $A_O$ and the flat area $A_F$ in the solid-state imaging device 10, for example. It should be noted that FIG. 3 shows only the light collecting layer 102 formed above (the upper surface of) the semiconductor substrate 101.

In FIG. 3, the on-chip lens formation area $A_O$ is formed in the area formed with the multiple unit pixels 31 (this area will be hereinafter referred to as the "imaging area $A_I$"), and the flat area $A_F$ is formed in the area outside the imaging area $A_I$ (this area will be hereinafter referred to as the "peripheral area $A_P$").

In FIG. 3, stress S indicated by an arrow in the drawing concentrates on the boundary between the on-chip lens formation area $A_O$ and the flat area $A_F$, and therefore, a corrugation phenomenon occurs in the flat area $A_F$ around the stress concentrating point. This was discovered through detailed simulations conducted by the inventor of the present technology.

Figure 4:
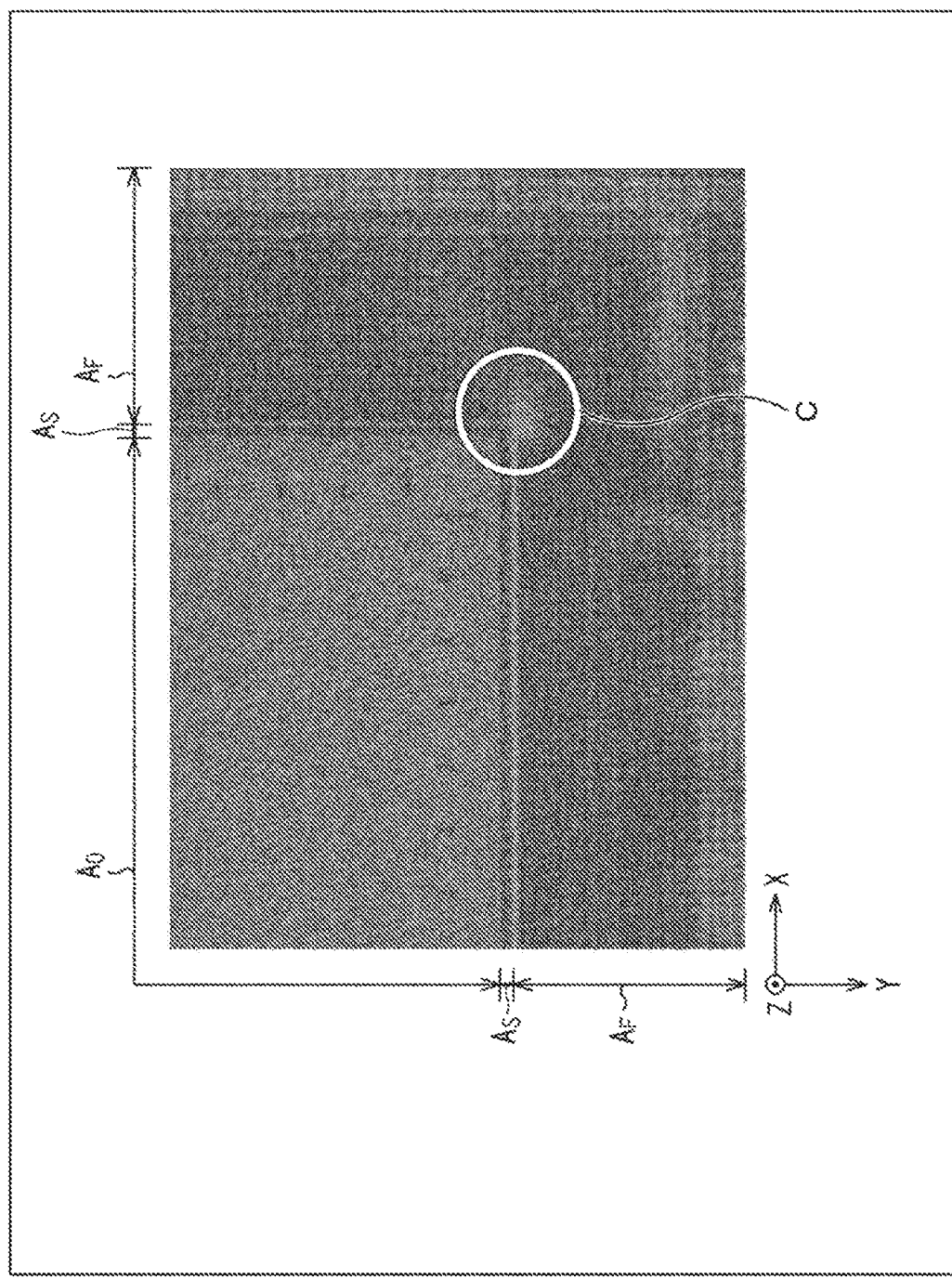
FIG. 4 is a diagram showing a specific example of a corrugation phenomenon.

FIG. 4 shows a corrugation phenomenon that has occurred at the boundary between the on-chip lens formation area $A_O$ and the flat area $A_F$. In FIG. 4, a corrugation phenomenon due to stress concentration has occurred in the area surrounded by a circle C. That is, the corrugation phenomenon has not occurred in the area inside the on-chip lens formation area $A_O$, but has occurred only at the boundary between the on-chip lens formation area $A_O$ and the flat area $A_F$. Specifically, a slit area $A_S$ is formed at the boundary between the on-chip lens formation area $A_O$ and the flat area $A_F$. Since the stress concentration occurs at the edge of the slit area $A_S$, a corrugation phenomenon occurs in the flat area $A_F$.

As described above, a corrugation phenomenon occurs due to stress concentration at the boundary between the on-chip lens formation area $A_O$ and the flat area $A_F$. Therefore, this stress concentration is prevented so that occurrences of a corrugation phenomenon can be reduced. Specifically, as shown in FIG. 5, the on-chip lens formation area $A_O$ is extended toward the peripheral area $A_P$ as much as structurally possible (extended to the etching edge in FIG. 5) so that stress concentration will not occur.

Figure 5:
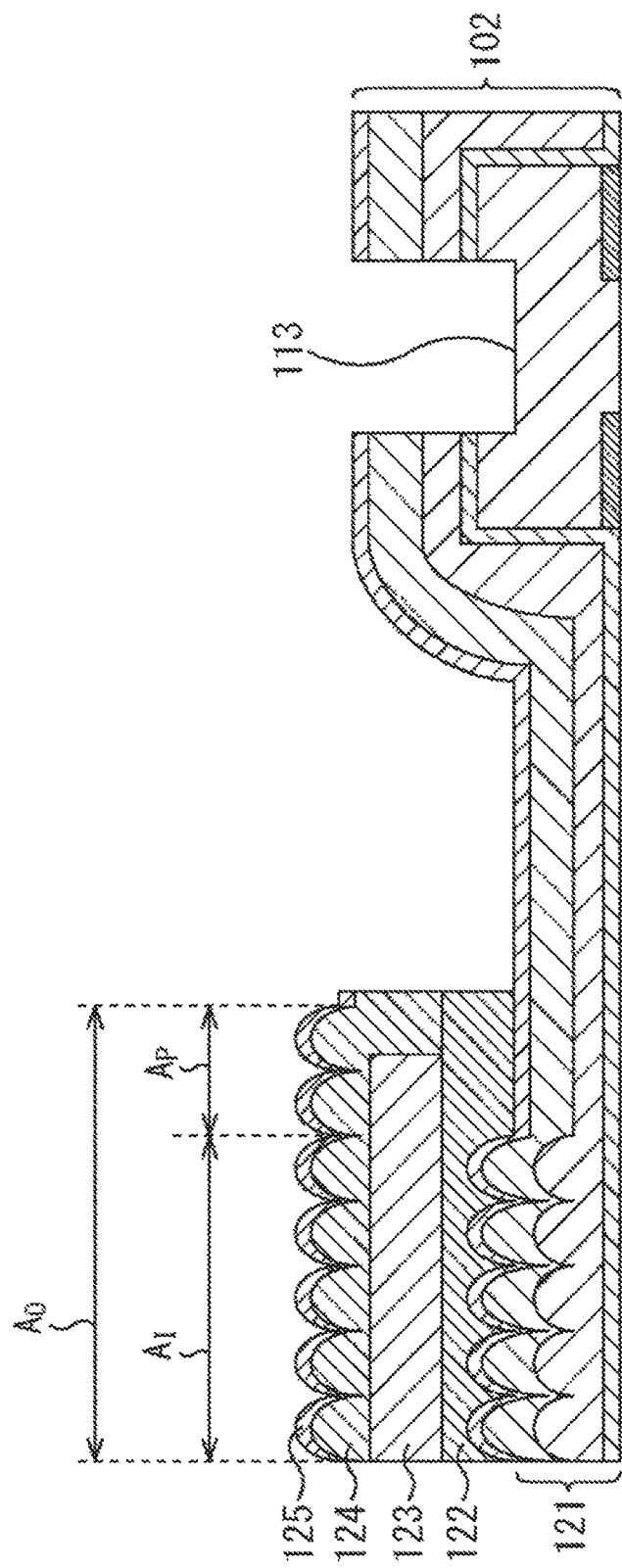
FIG. 5 is a cross-sectional view of a structure designed for avoiding corrugation phenomena.

In FIG. 5, the on-chip lens formation area $A_O$ is formed in the imaging area $A_I$ and the peripheral area $A_P$. Specifically, in the cross-section structure in FIG. 5, two more on-chip lenses are added, on the side of the peripheral area $A_P$, to the five on-chip lenses in the cross-section structure in FIG. 3, and the number of on-chip lenses becomes seven. While the on-chip lens formation area $A_O$ is extended in this manner, the flat area $A_F$ disappears.

As the on-chip lens formation area $A_O$ is extended, stress concentration at the boundary between the on-chip lens formation area $A_O$ and the flat area $A_F$ (or at the edge of the slit area $A_S$) is avoided, and consequently, the corrugation phenomenon can be prevented.

It should be noted that, in the cross-section structures in FIGS. 3 and 5, organic layers such as the antireflection film 125 are removed from the portion around the opening of the pad electrode 113, unlike those in the cross-section structure in FIG. 2. With this, in a case where a structure member 151 (FIG. 6) such as a rib is disposed on the sensor surface in a chip size package (CSP), a wafer-level chip size package (WCSP), or the like, the structure member 151 (FIG. 6) can be disposed in the area from which the organic layers have been removed. Particularly, such a structure can be employed in a case where the antireflection film 125 is formed on the outermost layer of the chip.

Figure 6:
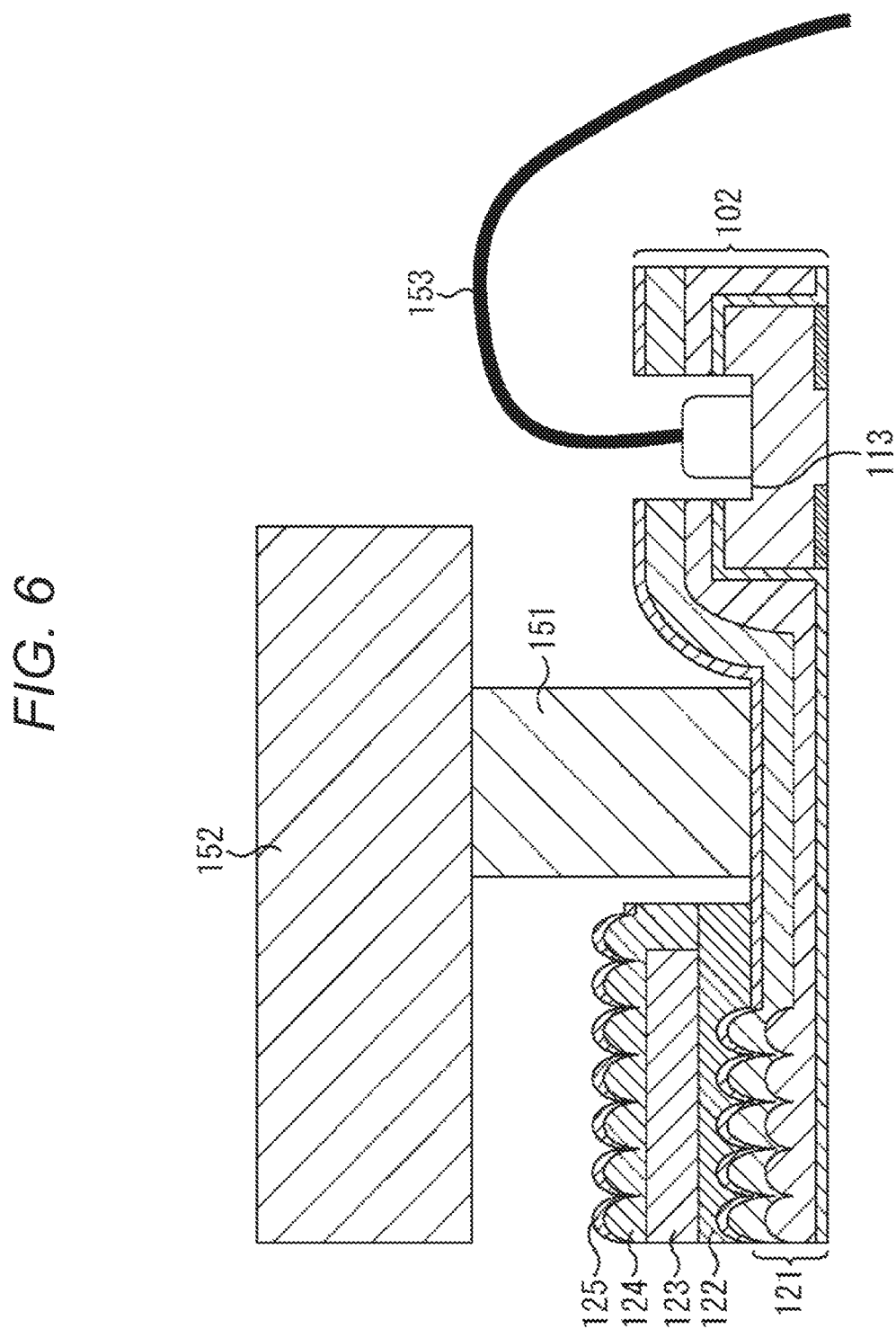
FIG. 6 is a cross-sectional view of a structure in which the organic layers around a structure member formation portion has been removed.

In FIG. 6, glass 152 is secured by the structure member 151 disposed in the area from which the organic layers have been removed. Meanwhile, the pad electrode 113 is connected to an external electrode via a wire 153.

(Specific Details of the Simulations)

Referring now to FIGS. 7 through 11, the specific details of the above mentioned simulations are described.

It should be noted that, although a corrugation phenomenon occurs due to stress concentration at the boundary between the on-chip lens formation area $A_O$ and the flat area $A_F$ (or at the edge of the slit area $A_S$) as already described, the inventor of the present technology confirmed that a corrugation phenomenon also occurs in the area affected by the wiring pattern in the flat area $A_F$. For ease of explanation, the simulation in the area affected by this wiring pattern will be referred to as "mode A", and the simulation at the boundary between the above described on-chip lens formation area $A_O$ and flat area $A_F$ will be referred to "mode B" in the description below.

(Results of Analyses in Mode B Before the Present Technology is Applied)

Figure 7:
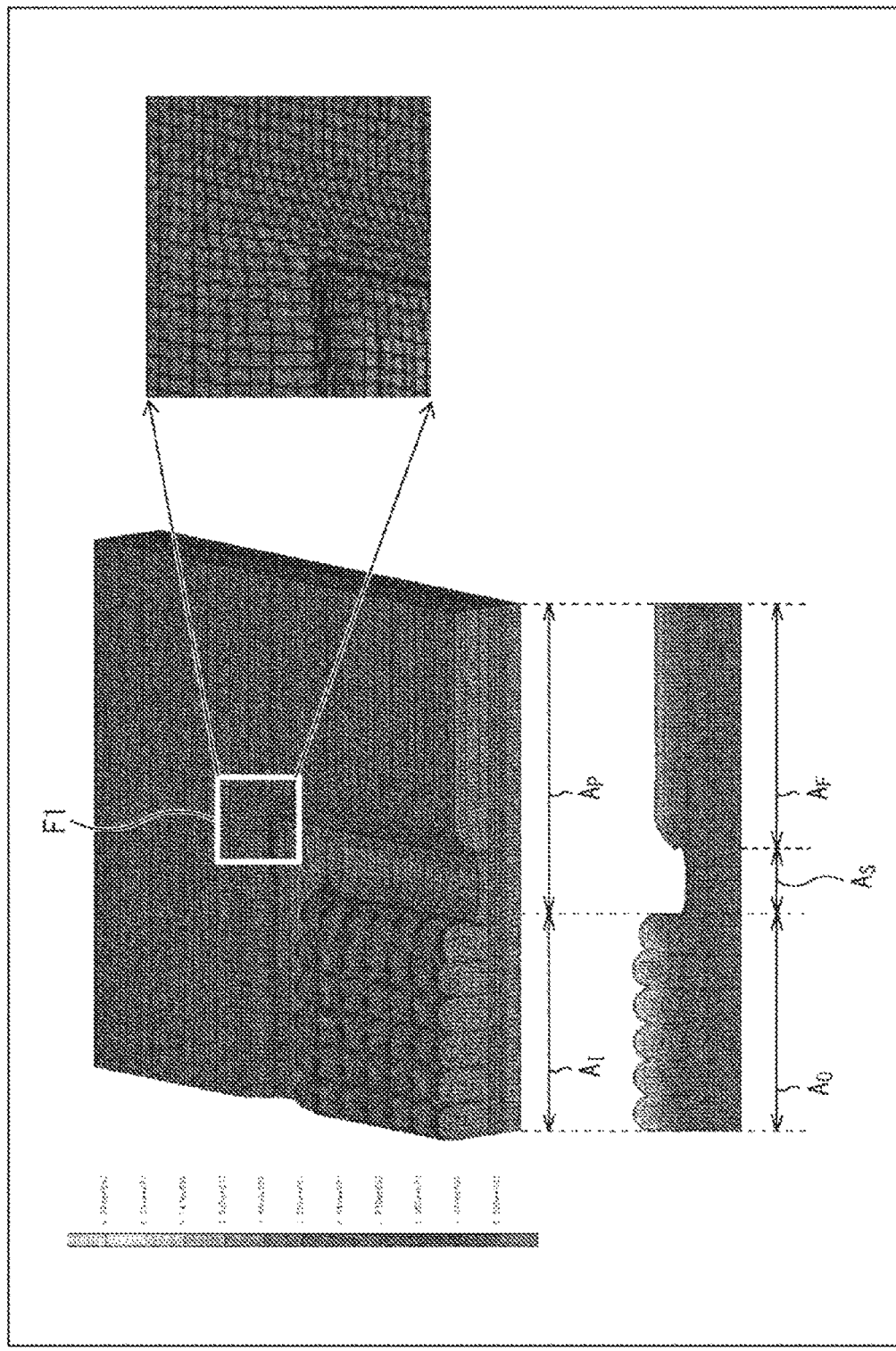
FIG. 7 is a perspective view illustrating a result of a stress analysis in mode B before the present technology is applied.
Figure 8:
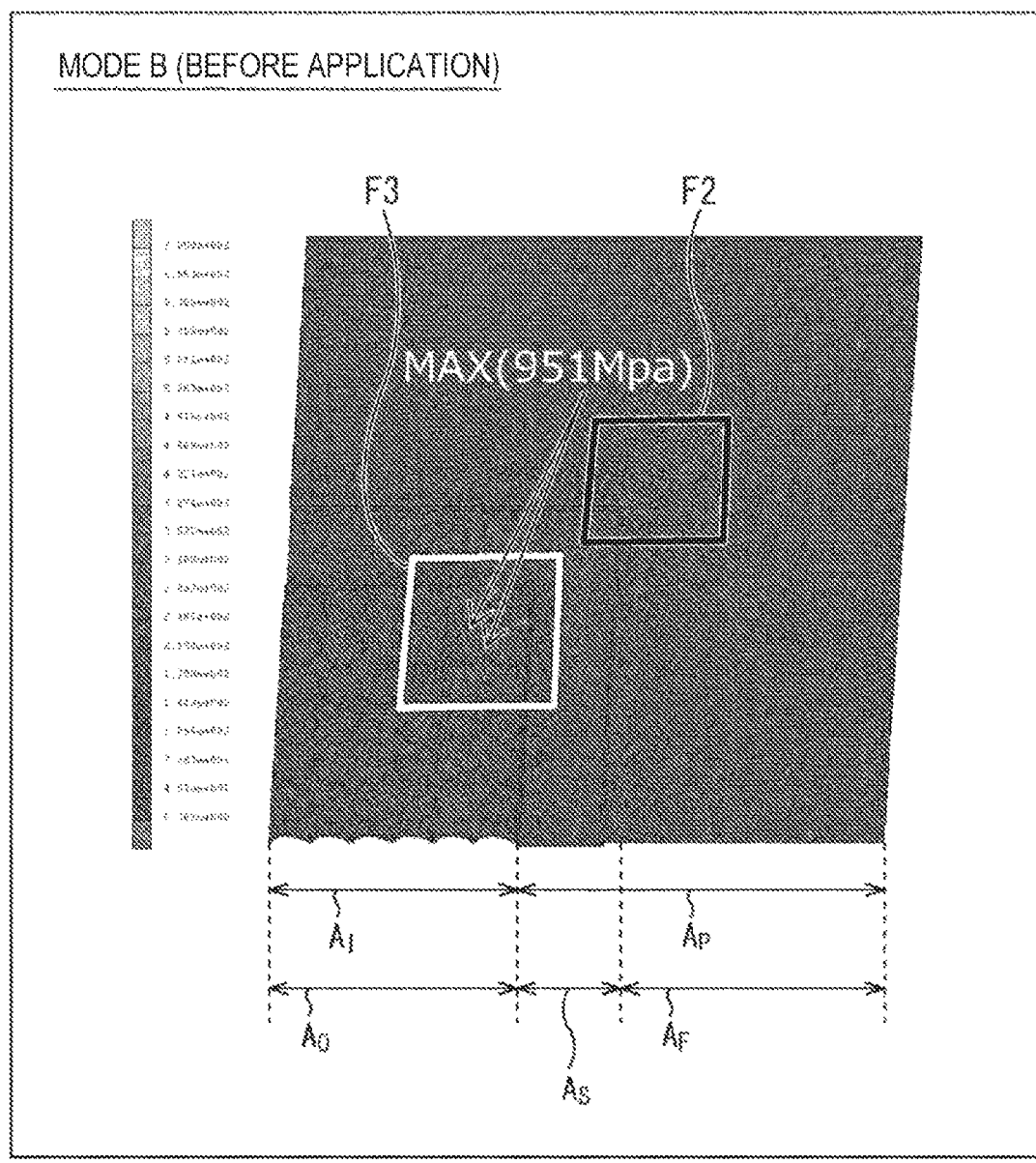
FIG. 8 is a perspective view illustrating a result of a stress analysis in mode B before the present technology is applied.

FIGS. 7 and 8 are perspective views illustrating results of stress analyses in mode B before the present technology is applied.

In FIG. 7, the on-chip lens formation area $A_O$ is not extended, and the flat area $A_F$ is formed in the peripheral area $A_P$. Also, in FIG. 7, the left-side axis in the drawing indicates the value of stress, and the ranges of the stress values in the respective areas are represented by variations in shade. That is, at the boundary between the on-chip lens formation area $A_O$ and the flat area $A_F$ (or at the edge of the slit area $A_S$), stress concentration occurred in the area in a frame F1.

In FIG. 8, in the area in a frame F2 at the boundary between the on-chip lens formation area $A_O$ and the flat area $A_F$ (or at the edge of the slit area $A_S$), stress concentration also occurred as in the area in the frame F1 in FIG. 7, and a corrugation phenomenon occurred. Meanwhile, in the area in a frame F3 on the on-chip lens formation area $A_O$ in FIG. 8, a stress of 951 Mpa at a maximum was applied, but any corrugation phenomenon did not occur.

That is, in FIG. 8, although the maximum value of the stress in the area in the frame F3 is larger than that in the area in the frame F2, any corrugation phenomenon due to a stress did not occur in the area in the frame F3. Since any corrugation phenomenon due to a stress in the area in the frame F3 on the on-chip lens formation area $A_O$ did not occur, it is possible to draw a conclusion (a hypothesis) that any corrugation phenomenon due to a stress does not occur in an area that is on the on-chip lens formation area $A_O$ and has a smaller stress than the maximum value (951 Mpa) of the stress in the area in the frame F3 applied thereto. In the description below, results of simulations based on this hypothesis are described.

(Result of an Analysis in Mode B after the Present Technology is Applied)

Figure 9:
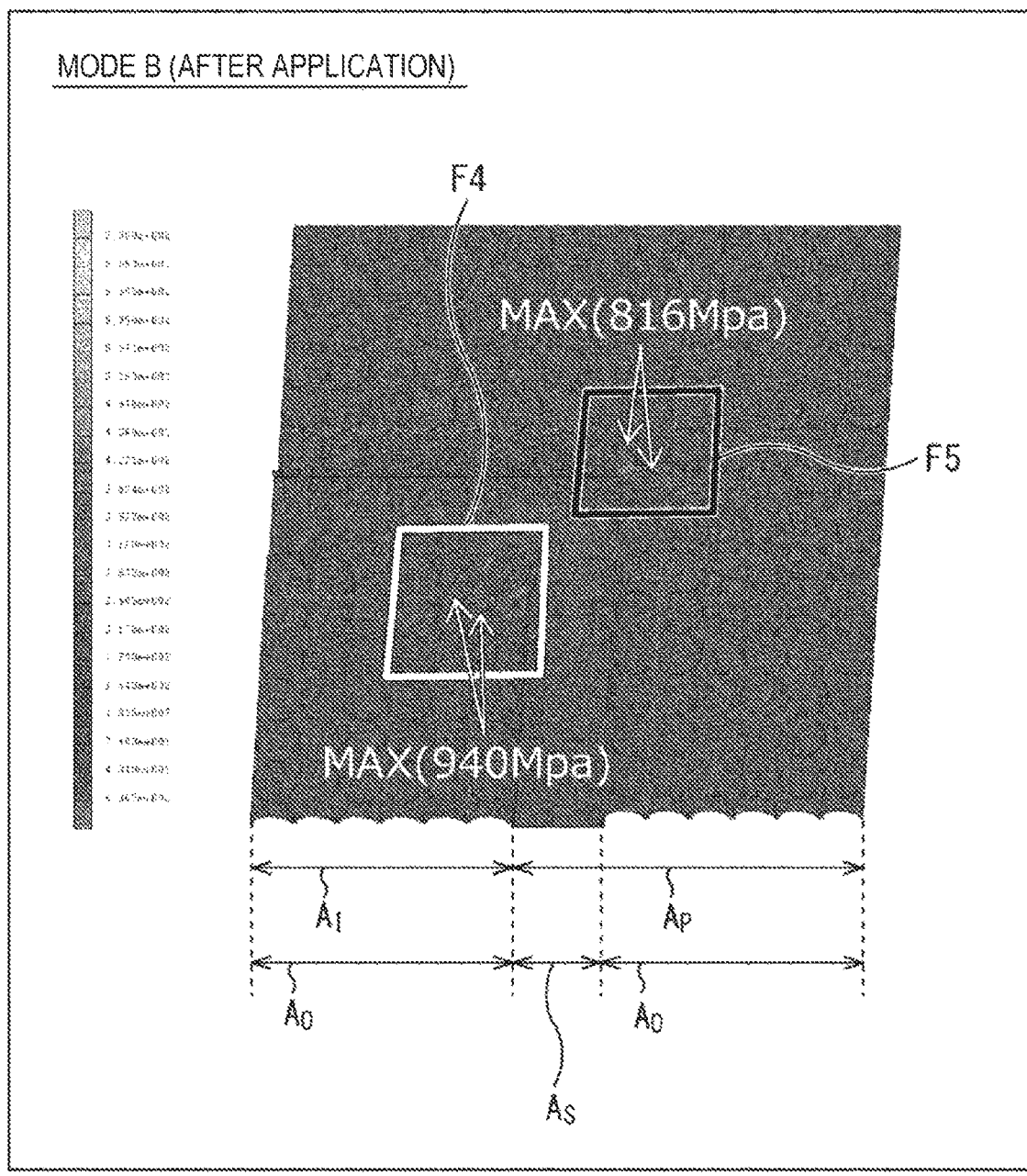
FIG. 9 is a perspective view illustrating a result of a stress analysis in mode B after the present technology is applied.

FIG. 9 is a perspective view illustrating a result of a stress analysis in mode B after the present technology is applied.

In FIG. 9, a stress of 940 Mpa at a maximum is applied in the area in a frame F4 on the on-chip lens formation area $A_O$, but the stress is smaller than the maximum value (951 Mpa) of the stress in the area in the frame F3 in FIG. 8. It was thus confirmed that any corrugation phenomenon does not occur. Also, in FIG. 9, a stress of 816 Mpa at a maximum is applied in the area in a frame F5 on the on-chip lens formation area $A_O$ extended to the peripheral area $A_P$ (an extended on-chip lens area), but the stress is smaller than the maximum value (951 Mpa) of the stress in the area in the frame F3 in FIG. 8. It was thus confirmed that any corrugation phenomenon does not occur.

(Result of an Analysis in Mode A after the Present Technology is Applied)

Figure 10:
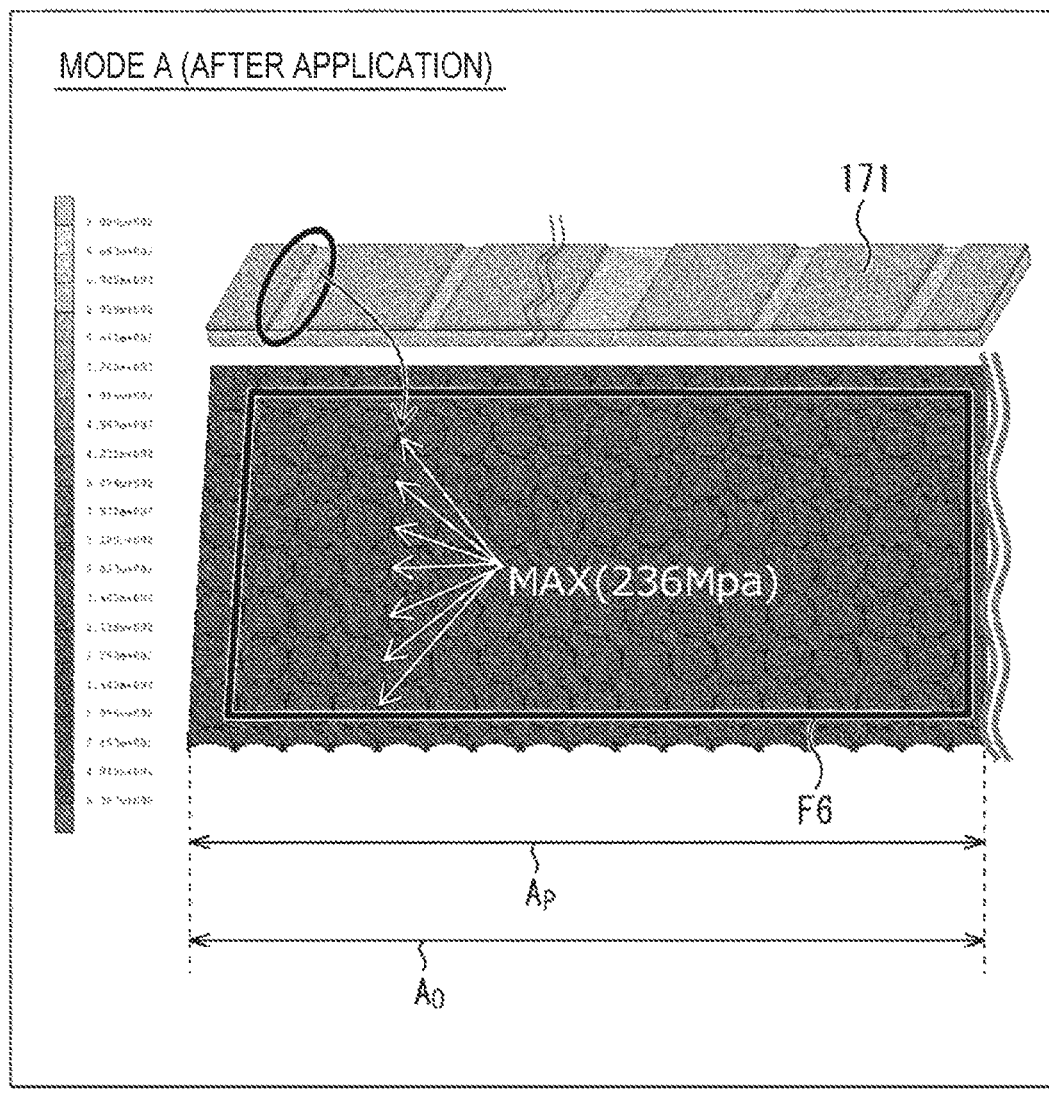
FIG. 10 is a perspective view illustrating a result of a stress analysis in mode A after the present technology is applied.

FIG. 10 is a perspective view illustrating a result of a stress analysis in mode A after the present technology is applied.

In FIG. 10, a stress of 236 Mpa at a maximum is applied in the area to be affected by a wiring pattern 171 in a frame F6 on the on-chip lens formation area $A_O$, but the stress is smaller than the maximum value (951 Mpa) of the stress in the area in the frame F3 in FIG. 8. It was thus confirmed that any corrugation phenomenon does not occur.

(Relationship Between Stresses and Corrugation Phenomena Before and after the Present Technology is Applied)

Figure 11:
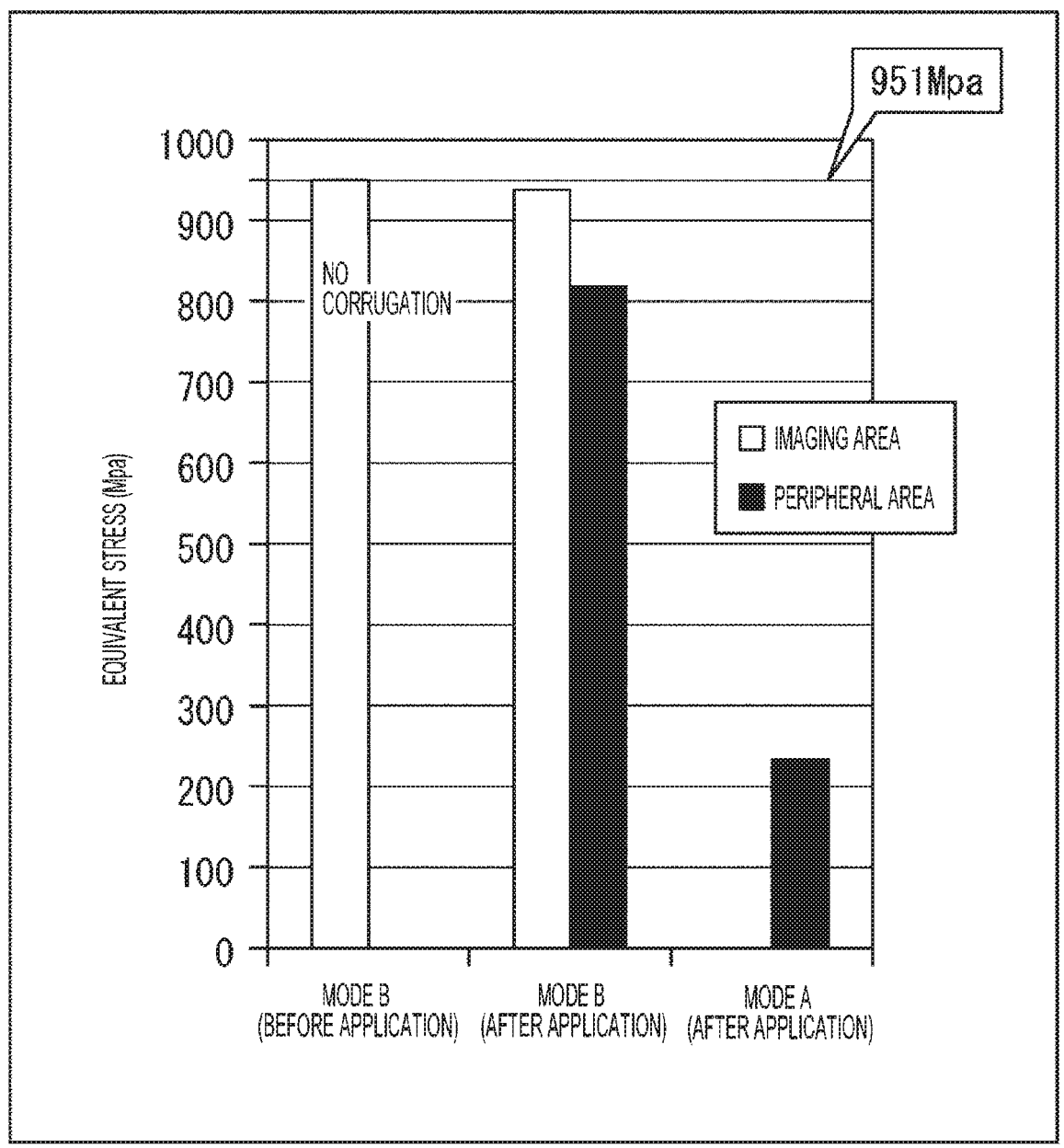
FIG. 11 is a graph showing the relationship between the stresses in modes A and B and corrugation phenomena before and after application of the present technology.

FIG. 11 is a graph showing the relationship between the stresses in modes A and B and the corrugation phenomena before and after application of the present technology. In FIG. 11, the ordinate axis indicates the value of stress (unit: Mpa). Meanwhile, the abscissa axis indicates the imaging area $A_I$ or the peripheral area $A_P$ in which stress analyses were carried out in modes A and B before and after application of the present technology. That is, in the imaging area $A_I$, the on-chip lens formation area $A_O$ is formed. In the peripheral area $A_P$, the flat area $A_F$ is formed before application of the present technology, and the on-chip lens formation area $A_O$ is formed after application of the present technology.

In FIG. 11, in the imaging area $A_I$ in mode B before application of the present technology (the area in the frame F3 in FIG. 8), a stress of 951 Mpa at a maximum was applied, but any corrugation phenomenon did not occur. Accordingly, it is possible to draw a conclusion that, in the area on the on-chip lens formation area $A_O$, any corrugation phenomenon does not occur in an area in which a smaller stress than the stress of 951 Mpa is applied.

Also, in FIG. 11, a stress of 940 Mpa at a maximum is applied in the imaging area $A_I$ in mode B after application of the present technology (the area in the frame F4 in FIG. 9), but the stress is smaller than the maximum value (951 Mpa) of the stress in the area where no corrugation has occurred (the area in the frame F3 in FIG. 8). It was thus confirmed that any corrugation phenomenon does not occur. Meanwhile, a stress of 816 Mpa at a maximum is applied in the peripheral area $A_P$ in mode B after application of the present technology (the area in the frame F5 in FIG. 9), but the stress is smaller than the maximum value (951 Mpa) of the stress in the area where no corrugation has occurred (the area in the frame F3 in FIG. 8). It was thus confirmed that any corrugation phenomenon does not occur.

Further, in FIG. 11, a stress of 236 Mpa at a maximum is applied in the peripheral area $A_P$ in mode A after application of the present technology (the area in the frame F6 in FIG. 10), but the stress is smaller than the maximum value (951 Mpa) of the stress in the area where no corrugation has occurred (the area in the frame F3 in FIG. 8). It was thus confirmed that any corrugation phenomenon does not occur.

Through the above simulations, it was confirmed that a corrugation phenomenon occurs due to stress concentration at the boundary between the on-chip lens formation area $A_O$ and the flat area $A_F$ (or at the edge of the slit area $A_S$), and that, as the on-chip lens formation area $A_O$ is extended, stress concentration at the boundary between the on-chip lens formation area $A_O$ and the flat area $A_F$ (or at the edge of the slit area $A_S$) is avoided, and consequently, corrugation phenomena can be prevented.

(Modifications of the On-Chip Lens Formation Area $A_O$)

In the above described embodiment, the on-chip lens formation area $A_O$ is extended to the peripheral area $A_P$ as much as structurally possible, so that stress concentration is prevented. However, if stress concentration, which is the cause of a corrugation phenomenon, does not occur, an embodiment other than the above embodiment may be employed. That is, as long as stress concentration, which is the cause of a corrugation phenomenon, does not occur at the boundary between the on-chip lens formation area $A_O$ and the flat area $A_F$ (or at the edge of the slit area $A_S$), the on-chip lens formation area $A_O$ may take various forms.

(Chamfered Shapes)

Figure 12A:
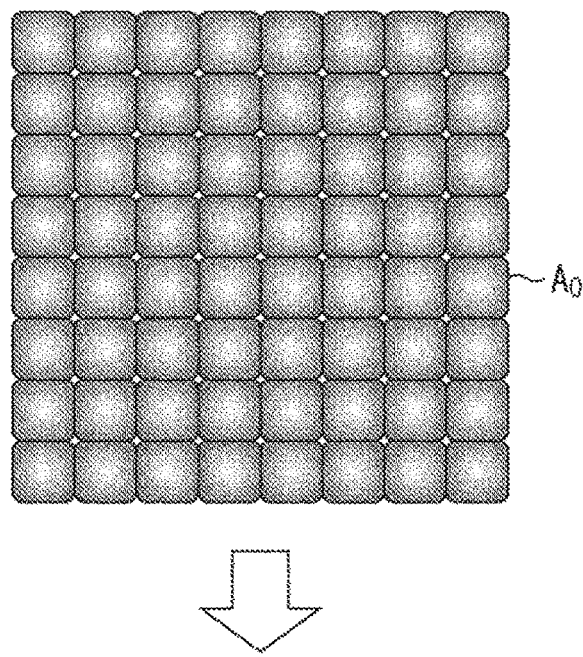
FIGS. 12A and 12B are enlarged top view of a chamfered structure in the on-chip lens formation area.

For example, FIG. 12A shows an enlarged view of an area at an edge portion (the upper left corner of a rectangular area, for example) formed with 8×8 on-chip lenses in the on-chip lens formation area AO. Here, as shown in FIG. 12B, in the area at an edge portion (hereinafter referred to as the "edge area AE") in the on-chip lens formation area AO, chamfering is performed by removing the on-chip lenses (ten on-chip lenses in this example) located near the upper left corner.

Figure 12B:
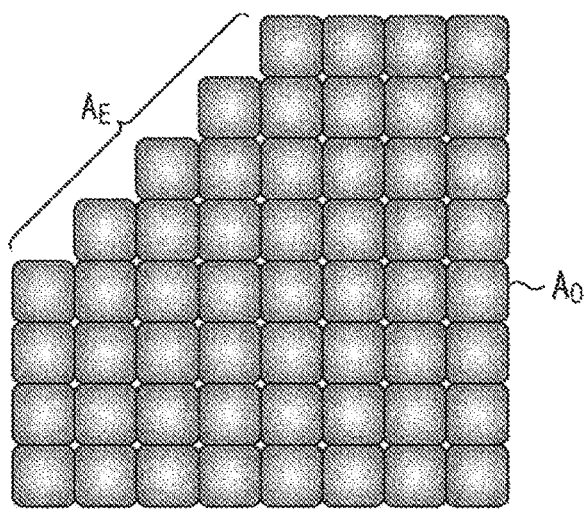

Although FIG. 12B shows only one corner (the upper left corner) of the four corners of the on-chip lens formation area AO (a rectangular area), chamfering is also performed at the other three corners (the lower left corner, the upper right corner, and the lower right corner) by removing on-chip lenses in an oblique direction.

In this manner, chamfering is performed at the four corners of the on-chip lens formation area $A_O$ having a rectangular shape. That is, in a case where the on-chip lens formation area $A_O$ has a rectangular shape, stress concentrates at the edge portions, and a corrugation phenomenon might occur. However, chamfering is performed so that stress concentration can be reduced, and occurrences of a corrugation phenomenon can be prevented.

Figure 13A:
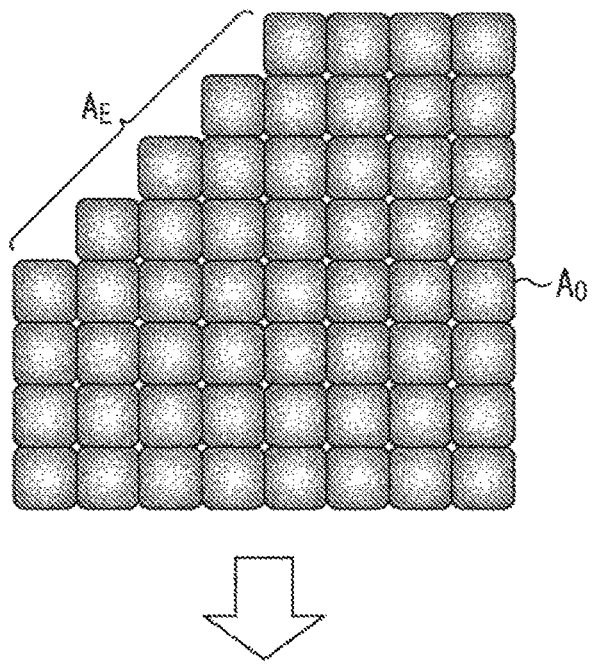
FIGS. 13A and 13B are enlarged top view of a chamfered structure in the on-chip lens formation area.

Meanwhile, each on-chip lens in the edge area AE of the on-chip lens formation area AO in FIG. 12B (FIG. 13A) also has a rectangular structure. To avoid this, on-chip lenses of a smaller size (diameter) than the on-chip lenses corresponding to the unit pixels 31 are further formed in the chamfered edge area AE, so that finer rectangular structures are formed.

Figure 13B:
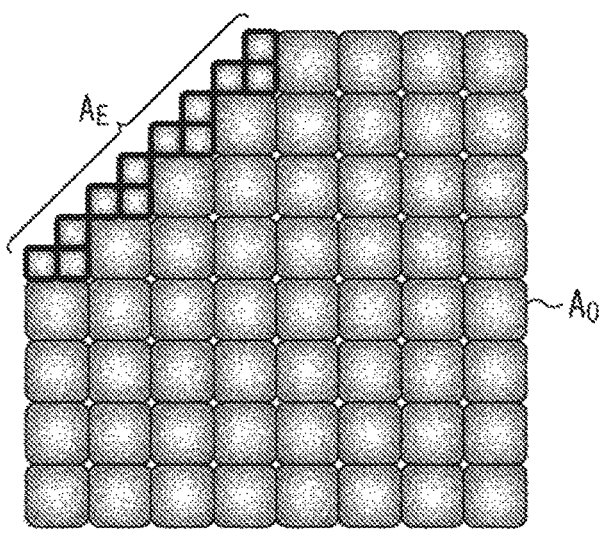

For example, in FIG. 13B, quarter on-chip lenses of a size that is a quarter of the size of the on-chip lenses are arranged in the positions of the on-chip lenses removed in the oblique direction in the edge area AE of the on-chip lens formation area AO. Here, three quarter on-chip lenses form one set, and four sets of quarter on-chip lenses are arranged in inverted L-shapes. In this manner, smoother chamfering is performed.

It should be noted that, in a similar way, sixteenth on-chip lenses formed by further quartering quarter on-chip lenses may be arranged in inverted L shapes, each set being formed with three sixteenth on-chip lenses. In this manner, even smoother chamfering is performed. That is, on-chip lenses are repeatedly quartered and are sequentially arranged in inverted L shapes in the edge area $A_E$, with each set being formed with three divisional on-chip lenses. In this manner, the chamfering becomes closer to perfect. Although only one corner (the upper left corner) of the four corners of the on-chip lens formation area $A_O$ is also shown in this example, chamfering is also performed at the other three corners (the lower left corner, the upper right corner, and the lower right corner).

(Circular or Elliptical Shapes)

The extended on-chip lens formation area $A_O$ does not necessarily have a rectangular shape like the imaging area $A_I$, but may have any appropriate shape.

For example, in FIG. 14A, the extended on-chip lens formation area AO has a chamfered rectangular shape. However, as shown in FIG. 14B, the on-chip lens formation area AO may have an elliptical shape. Although not shown in the drawings, the extended on-chip lens formation area AO may have some other shape, such as a circular shape, as long as the area overlapping with the imaging area AI is maintained. That is, to reduce stress concentration, a circular shape or a shape close to a circular shape is ideal. However, with a circular shape or a shape close to a circular shape, the peripheral area AP becomes larger accordingly. With this taken into account, an optimum shape should be employed.

(Shape with a Predetermined Curvature)

As shown in FIG. 15B, the extended area (extended on-chip lens areas) at the four corners of the on-chip lens formation area AO may also have a shape with a predetermined curvature, for example. That is, in this case, extended on-chip lens areas are formed as ear structures. As the shape with the predetermined curvature shown in FIG. 15B is employed, collet contact areas can be advantageously secured, for example.

(Curved Image Sensor)

An image sensor in a curved shape (a curved image sensor) that has a curved surface as the surface on the light incidence side (the imaging area $A_I$) may be employed as the solid-state imaging device 10. Particularly, in a case where a curved image sensor is used as the solid-state imaging device 10, a larger stress is applied to the center of the imaging area $A_I$, and therefore, an occurrence of a more conspicuous corrugation phenomenon is predicted. However, the on-chip lens formation area $A_O$ is extended according to the present technology, so that stress concentration at the boundary between the on-chip lens formation area $A_O$ and the flat area $A_F$ can be avoided, and a corrugation phenomenon can be prevented.

<2. Configurations of Camera Modules>

The present technology is not necessarily applied to solid-state imaging devices. Specifically, the present technology can be applied not only to solid-state imaging devices but also to any electronic apparatuses having solid-state imaging devices therein, such as camera modules having optical lens systems or the like, imaging apparatuses such as digital still cameras and video cameras, mobile terminal devices (smartphones and tablets, for example) having imaging functions, or copying machines that use solid-state imaging devices as the image reading units.

Figure 16:
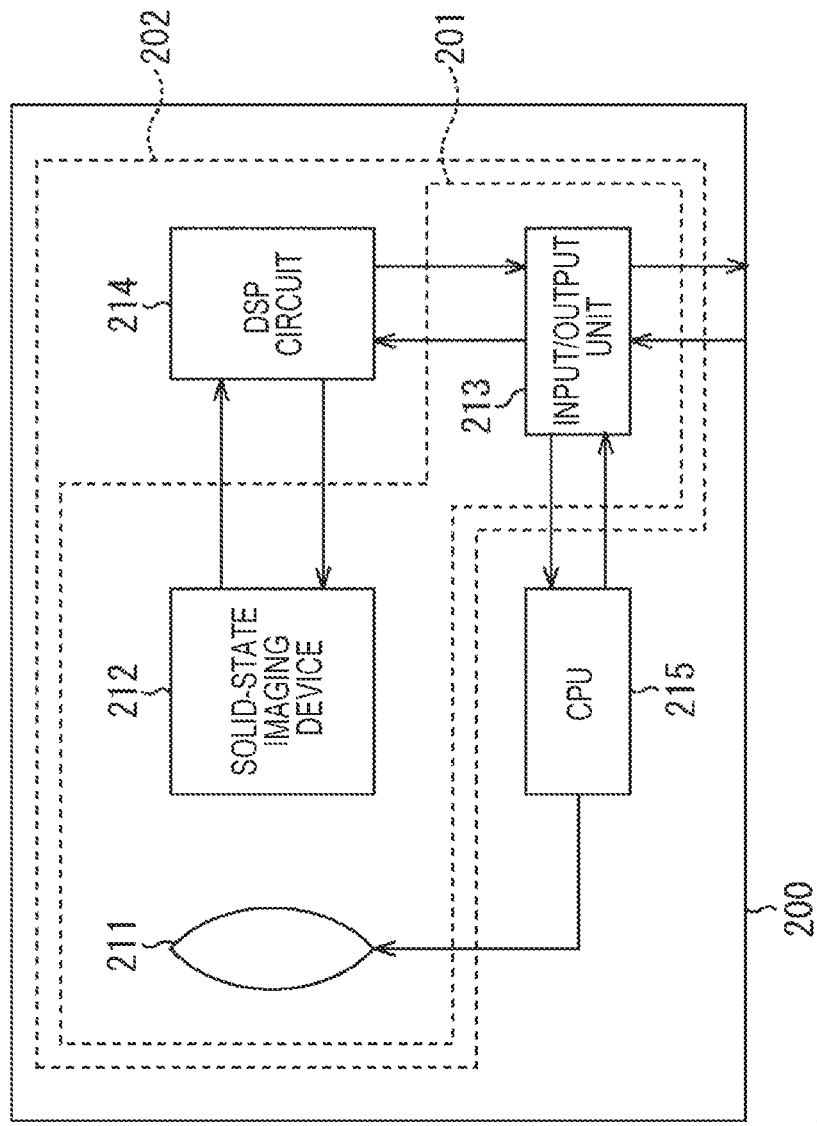
FIG. 16 is a diagram showing an example configuration of a camera module including a solid-state imaging device.

FIG. 16 is a diagram showing an example configuration of a camera module including a solid-state imaging device.

In FIG. 16, a camera module 200 is a module into which an optical lens system 211, a solid-state imaging device 212, an input/output unit 213, a digital signal processor (DSP) circuit 214, and a CPU 215 are incorporated.

The solid-state imaging device 212 is equivalent to the solid-state imaging device 10 in FIG. 1, and has the cross-section structure in FIG. 5, for example. That is, in the solid-state imaging device 212, the on-chip lens formation area $A_O$ is extended as much as structurally possible. The solid-state imaging device 212 captures incident light (image light) from the object via the optical lens system 211, converts the amount of the incident light gathered on the imaging surface into an electrical signal for each pixel, and outputs the electrical signal as a pixel signal.

The input/output unit 213 serves as an input/output interface with the outside. The DSP circuit 214 is a camera signal processing circuit that processes signals supplied from the solid-state imaging device 212. The CPU 215 controls the optical lens system 211, and exchange data with the input/output unit 213.

Alternatively, a camera module 201 may be a module formed only with the optical lens system 211, the solid-state imaging device 212, and the input/output unit 213, for example. In this case, pixel signals from the solid-state imaging device 212 are output via the input/output unit 213. Further, a camera module 202 may be a module formed with the optical lens system 211, the solid-state imaging device 212, the input/output unit 213, and the DSP circuit 214. In this case, pixel signals from the solid-state imaging device 212 are processed by the DSP circuit 214, and are output via the input/output unit 213.

The camera modules 200, 201, and 202 are configured as above. As the solid-state imaging device 212 having a structure for avoiding stress concentration that is the cause of a corrugation phenomenon is provided in the camera modules 200, 201, and 202, a defect in appearance, such as resin corrugation, can be prevented in the solid-state imaging device 212.

<3. Configuration of an Electronic Apparatus>

Figure 17:
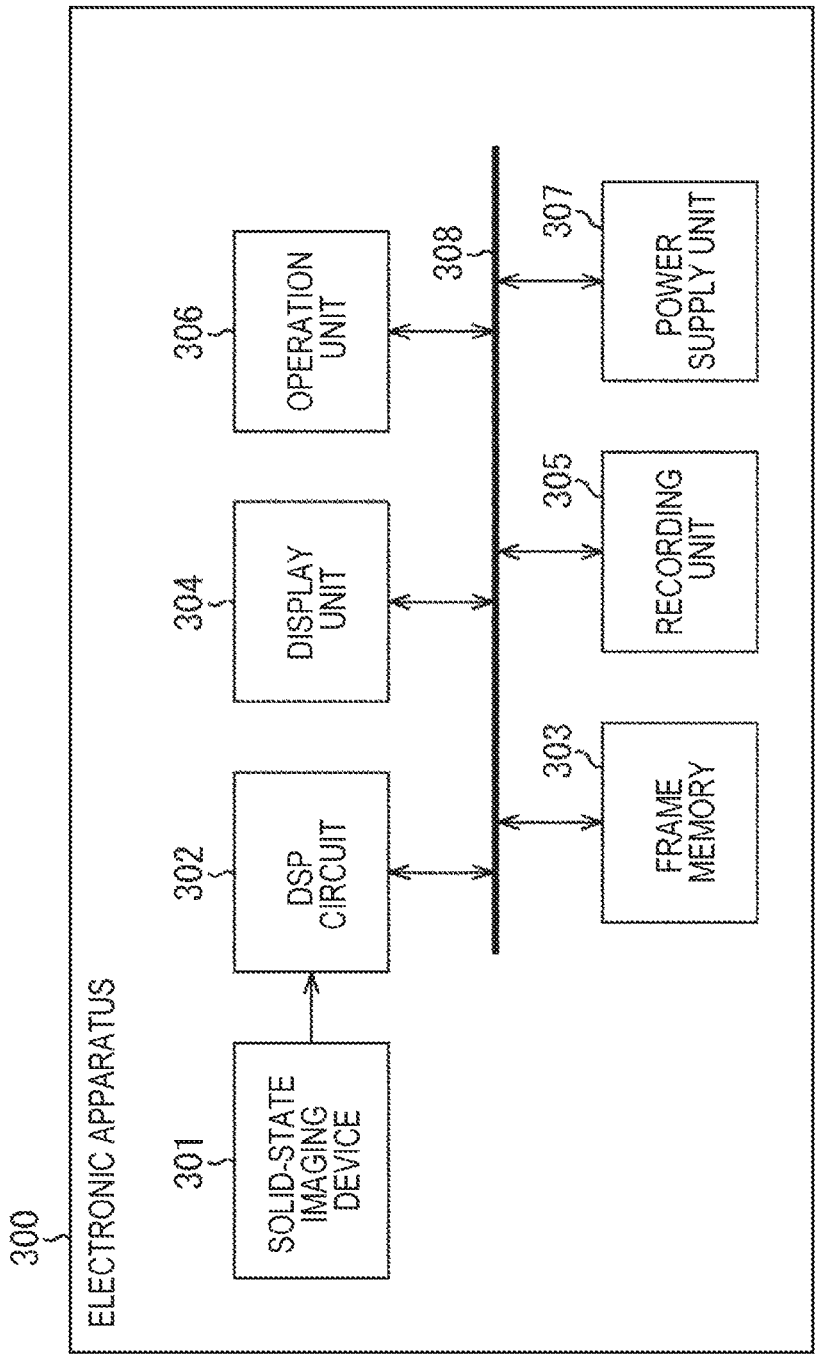
FIG. 17 is a diagram showing an example configuration of an electronic apparatus including a solid-state imaging device.

FIG. 17 is a block diagram showing an example configuration of an electronic apparatus including a solid-state imaging device.

An electronic apparatus 300 in FIG. 17 is an electronic apparatus, such as an imaging apparatus like a digital still camera or a video camera, or a mobile terminal device like a smartphone or a tablet.

In FIG. 17, the electronic apparatus 300 includes a solid-state imaging device 301, a DSP circuit 302, a frame memory 303, a display unit 304, a recording unit 305, an operation unit 306, and a power supply unit 307. Also, in the electronic apparatus 300, the DSP circuit 302, the frame memory 303, the display unit 304, the recording unit 305, the operation unit 306, and the power supply unit 307 are connected to one another via a bus line 308.

The solid-state imaging device 301 is equivalent to the solid-state imaging device 10 in FIG. 1, and has the cross-section structure in FIG. 5, for example. That is, in the solid-state imaging device 301, the on-chip lens formation area $A_O$ is extended as much as structurally possible. The solid-state imaging device 301 captures incident light (image light) from the object via an optical lens system (not shown), converts the amount of the incident light gathered on the imaging surface into an electrical signal for each pixel, and outputs the electrical signal as a pixel signal.

The DSP circuit 302 is a camera signal processing circuit that processes signals supplied from the solid-state imaging device 301. The DSP circuit 302 outputs image data obtained by processing the signals from the solid-state imaging device 301. The frame memory 303 temporarily stores, on a frame-by-frame basis, the image data processed by the DSP circuit 302.

The display unit 304 is formed with a panel display device such as a liquid crystal panel or an organic electro-luminescence (EL) panel, and displays a moving image or a still image formed by the solid-state imaging device 301. The recording unit 305 records the image data of the moving image or the still image formed by the solid-state imaging device 301 into a recording medium such as a semiconductor memory or a hard disk.

The operation unit 306 outputs operation instructions as to the various functions of the electronic apparatus 300, in accordance with operations performed by the user. The power supply unit 307 supplies various power sources as the operation power sources for the DSP circuit 302, the frame memory 303, the display unit 304, the recording unit 305, and the operation unit 306, as appropriate.

The electronic apparatus 300 is configured as above. As the solid-state imaging device 301 having a structure for avoiding stress concentration that is the cause of a corrugation phenomenon is provided in the electronic apparatus 300, a defect in appearance, such as resin corrugation, can be prevented in the solid-state imaging device 301.

<4. Examples of Use of a Solid-State Imaging Device>

Figure 18:
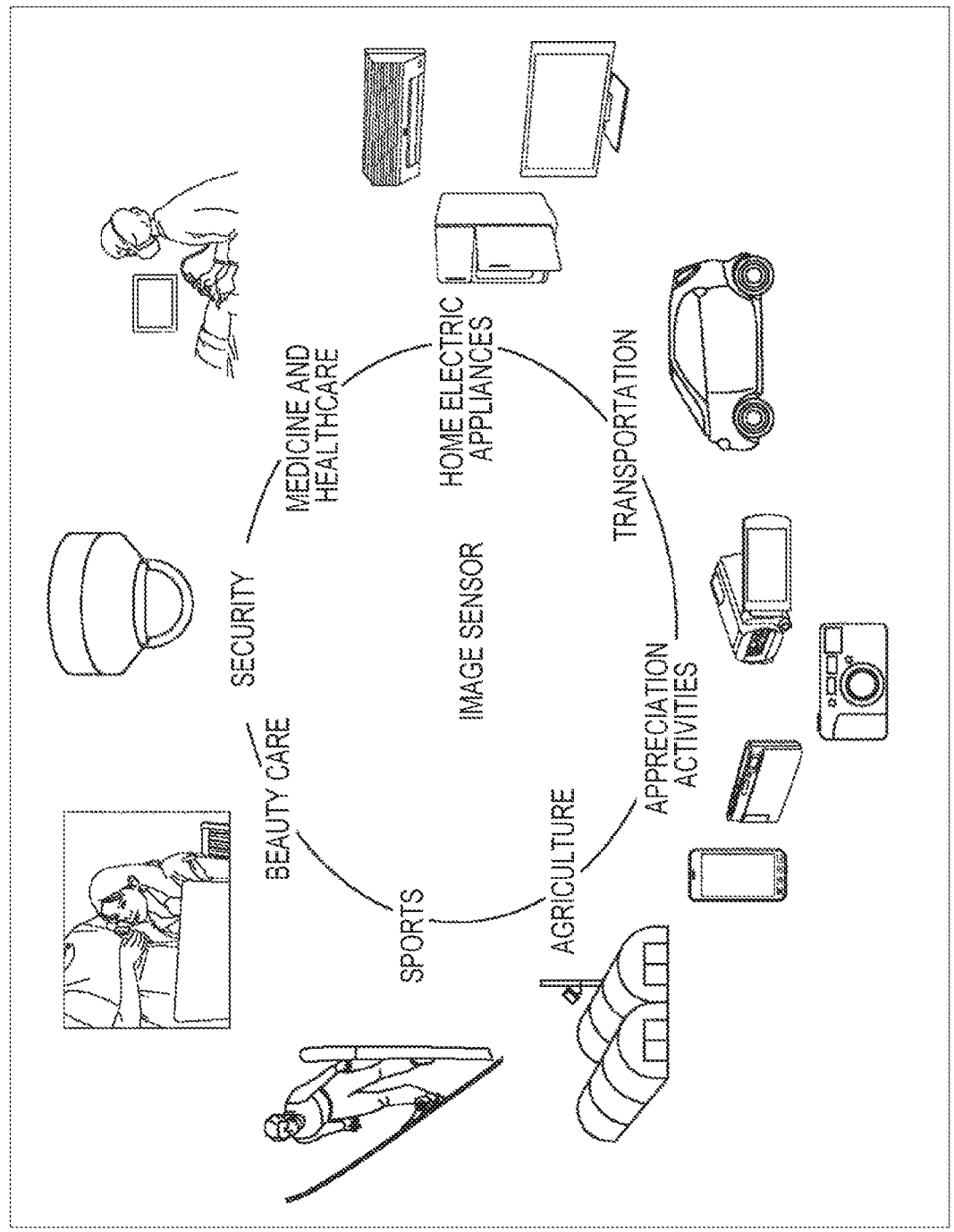
FIG. 18 is a diagram showing examples of use of a solid-state imaging device.

FIG. 18 is a diagram showing examples of use of the solid-state imaging device 10 as an image sensor.

The above described solid-state imaging device 10 can be used in various cases where light such as visible light, infrared light, ultraviolet light, or an X-ray is sensed, as described below. That is, as shown in FIG. 18, the solid-state imaging device 10 can be employed in an apparatus that is used not only in the appreciation activity field where images are taken and are used in appreciation activities, but also in the field of transportation, the field of home electric appliances, the fields of medicine and healthcare, the field of security, the field of beauty care, the field of sports, or the field of agriculture, for example.

Specifically, in the appreciation activity field, the solid-state imaging device 10 can be employed in apparatuses (the electronic apparatus 300 in FIG. 17, for example) for taking images to be used in appreciation activities, such as digital cameras, smartphones, and mobile telephones with camera functions, as described above.

In the field of transportation, the solid-state imaging device 10 can be employed in apparatuses for transportation use, such as vehicle-mounted sensors configured to take images of the front, the back, the surroundings, and the inside of an automobile to perform safe driving like an automatic stop and recognize a driver's condition, surveillance cameras for monitoring running vehicles and roads, and ranging sensors for measuring distances between vehicles.

In the field of home electric appliances, the solid-state imaging device 10 can be employed in apparatuses to be used in conjunction with home electric appliances, such as television sets, refrigerators, and air conditioners, to take images of gestures of users and operate the appliances in accordance with the gestures. Also, in the fields of medicine and healthcare, the solid-state imaging device 10 can be employed in apparatuses for medical use and healthcare use, such as endoscopes and apparatuses for receiving infrared light for angiography.

In the field of security, the solid-state imaging device 10 can be employed in apparatuses for security use, such as surveillance cameras for crime prevention and cameras for personal authentication. Also, in the field of beauty care, the solid-state imaging device 10 can be employed in apparatuses for beauty care use, such as skin measurement apparatuses configured to image a skin and microscopes for imaging a scalp.

In the field of sports, the solid-state imaging device 10 can be employed in apparatuses for sporting use, such as action cameras and wearable cameras for sports. Also, in the field of agriculture, the solid-state imaging device 10 can be employed in apparatuses for agricultural use, such as cameras for monitoring conditions of fields and crops.

It should be noted that embodiments of the present technology are not limited to the above described embodiments, and various modifications may be made to them without departing from the scope of the present technology. For example, it is possible to employ a combination of all or some of the above described embodiments.

The present technology may also be embodied in the configurations described below.

(1)

A solid-state imaging device including:

a semiconductor substrate having pixels formed therein, the pixels each including a photoelectric conversion element; and on-chip lenses formed above the semiconductor substrate, the on-chip lenses corresponding to the pixels, wherein the area in which the on-chip lenses are formed is extended to a peripheral area outside an imaging area formed with the pixels.

(2)

The solid-state imaging device of (1), wherein the area in which the on-chip lenses are formed is extended to the peripheral area as much as structurally possible in the solid-state imaging device.

(3)

The solid-state imaging device of (1) or (2), wherein the area in which the on-chip lenses are formed has a shape chamfered at edge portions.

(4)

The solid-state imaging device of (3), wherein on-chip lenses of a smaller size than the on-chip lenses corresponding to the pixels are formed in the chamfered areas at the edge portions in the area in which the on-chip lenses are formed.

(5)

The solid-state imaging device of (1) or (2), wherein the area in which the on-chip lenses are formed has any appropriate shape.

(6)

The solid-state imaging device of (5), wherein the area in which the on-chip lenses are formed has a circular shape or an elliptical shape.

(7)

The solid-state imaging device of (5), wherein the area in which the on-chip lenses are formed has a shape with a predetermined curvature.

(8)

A camera module including:

a solid-state imaging device;

an optical lens system; and a signal processing device, the solid-state imaging device including:

a semiconductor substrate having pixels formed therein, the pixels each including a photoelectric conversion element; and on-chip lenses formed above the semiconductor substrate, the on-chip lenses corresponding to the pixels, wherein the area in which the on-chip lenses are formed is extended to a peripheral area outside an imaging area formed with the pixels.

(9)
An electronic apparatus including
a solid-state imaging device,
the solid-state imaging device including:
a semiconductor substrate having pixels formed therein, the pixels each including a photoelectric conversion element; and on-chip lenses formed above the semiconductor substrate, the on-chip lenses corresponding to the pixels, wherein the area in which the on-chip lenses are formed is extended to a peripheral area outside an imaging area formed with the pixels.

REFERENCE SIGNS LIST

10 Solid-state imaging device
21 Pixel array unit
31 Unit pixel
101 Semiconductor substrate
102 Light collecting layer
111 Silicon substrate
112 Photodiode
113 Pad electrode
121 Inorganic film
122 Flattening film
123 Color filter
124 Lens resin film
125 Antireflection film
151 Structure member
152 Glass
200, 201, 202 Camera module
212 Solid-state imaging device
300 Electronic apparatus
301 Solid-state imaging device

The invention claimed is:

1. A solid-state imaging device, comprising:
a semiconductor substrate having a plurality of pixels, wherein each pixel of the plurality of pixels includes a photoelectric conversion element;
a color filter layer above the semiconductor substrate; and
a first plurality of on-chip lenses above the color filter layer, wherein
each on-chip lens of the first plurality of on-chip lenses corresponds to one of the plurality of pixels,
an area corresponding to the first plurality of on-chip lenses is extended to a peripheral area,
the peripheral area includes a second plurality of on-chip lenses,
a size of each on-chip lens of the first plurality of on-chip lenses is same as a size of each on-chip lens of the second plurality of on-chip lenses,
each of the second plurality of on-chip lenses and the first plurality of on-chip lenses includes a plurality of films,
the plurality of films is adjacent to the color filter layer,
the plurality of films comprises an anti-reflection film on a light-incidence side of the first plurality of on-chip lenses and the second plurality of on-chip lenses, and the peripheral area is outside an imaging area corresponding to the plurality of pixels.

2. The solid-state imaging device according to claim 1, wherein the area corresponding to the first plurality of on-chip lenses is extended to the peripheral area based on a structure of the solid-state imaging device.

3. The solid-state imaging device according to claim 1, wherein the area has a shape chamfered at edge portions.

4. The solid-state imaging device according to claim 3, wherein the second plurality of on-chip lenses is in a plurality of chamfered areas at the edge portions in the area.

5. The solid-state imaging device according to claim 1, wherein the peripheral area that has the second plurality of on-chip lenses has a shape different from the area corresponding to the first plurality of on-chip lenses.

6. The solid-state imaging device according to claim 5, wherein the shape of the peripheral area is one of a circular shape or an elliptical shape.

7. The solid-state imaging device according to claim 5, wherein the shape of the peripheral area that has the second plurality of on-chip lenses has a specific curvature.

8. The solid-state imaging device according to claim 1, wherein the plurality of films further comprises a lens resin film on the light-incidence side of the first plurality of on-chip lenses and the second plurality of on-chip lenses.

9. The solid-state imaging device according to claim 8, wherein the lens resin film is between the anti-reflection film and the color filter layer.

10. The solid-state imaging device according to claim 1, further comprising a flattening film between the color filter layer and the semiconductor substrate.

11. The solid-state imaging device according to claim 4, wherein the second plurality of on-chip lenses is arranged in inverted L-shapes in the plurality of chamfered areas at the edge portions.

12. A camera module, comprising:
a solid-state imaging device;
an optical lens; and
a signal processing device,
wherein the solid-state imaging device includes:
a semiconductor substrate having a plurality of pixels, wherein each pixel of the plurality of pixels includes a photoelectric conversion element;
a color filter layer above the semiconductor substrate; and
a first plurality of on-chip lenses above the color filter layer, wherein
each on-chip lens of the first plurality of on-chip lenses corresponds to one of the plurality of pixels,
an area corresponding to the first plurality of on-chip lenses is extended to a peripheral area,
the peripheral area includes a second plurality of on-chip lenses,
a size of each on-chip lens of the first plurality of on-chip lenses is same as a size of each on-chip lens of the second plurality of on-chip lenses,
each of the second plurality of on-chip lenses and the first plurality of on-chip lenses includes a plurality of films,
the plurality of films is adjacent to the color filter layer,
the plurality of films comprises an anti-reflection film on a light-incidence side of the first plurality of on-chip lenses and the second plurality of on-chip lenses, and the peripheral area is outside an imaging area corresponding to the plurality of pixels.

13. An electronic apparatus, comprising:
a solid-state imaging device that includes:
- a semiconductor substrate having a plurality of pixels, wherein each pixel of the plurality of pixels includes a photoelectric conversion element;
- a color filter layer above the semiconductor substrate; and
- a first plurality of on-chip lenses above the color filter layer, wherein
  - each on-chip lens of the first plurality of on-chip lenses corresponds to one of the plurality of pixels,
  - an area corresponding to the first plurality of on-chip lenses is extended to a peripheral area,
  - the peripheral area includes a second plurality of on-chip lenses,
  - a size of each on-chip lens of the first plurality of on-chip lenses is same as a size of each on-chip lens of the second plurality of on-chip lenses,
  - each of the second plurality of on-chip lenses and the first plurality of on-chip lenses includes a plurality of films,
  - the plurality of films is adjacent to the color filter layer,
  - the plurality of films comprises an anti-reflection film on a light-incidence side of the first plurality of on-chip lenses and the second plurality of on-chip lenses, and
  - the peripheral area is outside an imaging area corresponding to the plurality of pixels.

14. The solid-state imaging device according to claim 1, wherein the plurality of films of the second plurality of on-chip lenses and the plurality of films of the first plurality of on-chip lenses are the same.

* * * * *